(12) United States Patent
Lee et al.

(10) Patent No.: US 11,491,774 B1
(45) Date of Patent: Nov. 8, 2022

(54) SOLAR PANEL DISASSEMBLING APPARATUS

(71) Applicant: Won Kwang S&T Co., Ltd., Incheon (KR)

(72) Inventors: Sang Hun Lee, Incheon (KR); Jun Kee Kim, Seoul (KR); Tae Eun Lee, Incheon (KR); Cheong Min Noh, Incheon (KR); Geun Sik Cho, Incheon (KR); Su Hyon Eom, Incheon (KR)

(73) Assignee: Won Kwang S&T Co., Ltd., Incheon (KR)

( * ) Notice: Subject to any disclaimer, the term of this patent is extended or adjusted under 35 U.S.C. 154(b) by 0 days.

(21) Appl. No.: 17/519,699

(22) Filed: Nov. 5, 2021

(30) Foreign Application Priority Data

Aug. 10, 2021 (KR) .................. 10-2021-0105656

(51) Int. Cl.
*B32B 43/00* (2006.01)
*H01L 31/18* (2006.01)
*H02S 30/10* (2014.01)

(52) U.S. Cl.
CPC ............ *B32B 43/006* (2013.01); *H01L 31/18* (2013.01); *H02S 30/10* (2014.12); *B32B 2457/12* (2013.01); *Y10S 156/922* (2013.01); *Y10S 156/924* (2013.01); *Y10S 156/937* (2013.01); *Y10T 156/1153* (2015.01); *Y10T 156/1158* (2015.01);
(Continued)

(58) Field of Classification Search
CPC .............. B32B 43/006; Y10T 156/1153; Y10T 156/1158; Y10T 156/1184; Y10T 156/1911; Y10T 156/1917; Y10T 156/1961; Y10T 156/1967; Y10S 156/922; Y10S 156/924; Y10S 156/937
See application file for complete search history.

(56) References Cited

U.S. PATENT DOCUMENTS

| 4,618,395 A | * | 10/1986 | Breucha | ............... B23D 49/006 156/80 |
| 8,261,804 B1 | * | 9/2012 | Huang | .................. B32B 43/006 156/707 |

(Continued)

FOREIGN PATENT DOCUMENTS

| KR | 10-2015-0113316 A | 10/2015 |
| KR | 10-1916637 B1 | 11/2018 |

(Continued)

*Primary Examiner* — Philip C Tucker
*Assistant Examiner* — Nickolas R Harm
(74) *Attorney, Agent, or Firm* — The PL Law Group, PLLC

(57) ABSTRACT

A solar panel disassembling apparatus for disassembling a solar panel including a glass plate and a stacked film, includes a supporting plate of which is in contact with the glass plate, a moving scraper module including a first body moving in parallel with the supporting plate, a first elevator moving vertically, and a blade connected to the first elevator and changing in height and scraping the stacked film using the blade, and a moving pressing module including a second body moving in parallel with the supporting plate, a second elevator vertically, and a pressing unit connected to the second elevator and changing in height. The moving pressing module is disposed forward in the forward movement direction of the moving scraper module and presses and aligns the stacked film using the pressing unit ahead of the moving scraper module.

9 Claims, 9 Drawing Sheets

(52) U.S. Cl.
CPC .... *Y10T 156/1184* (2015.01); *Y10T 156/1911* (2015.01); *Y10T 156/1917* (2015.01); *Y10T 156/1961* (2015.01); *Y10T 156/1967* (2015.01)

(56) References Cited

U.S. PATENT DOCUMENTS

| | | | |
|---|---|---|---|
| 8,960,255 B2 * | 2/2015 | Li | B32B 38/10 |
| | | | 156/717 |
| 8,985,177 B2 * | 3/2015 | Zhuang | B26D 7/08 |
| | | | 156/763 |
| 9,616,652 B2 * | 4/2017 | Wu | B32B 43/006 |
| 2020/0247106 A1 * | 8/2020 | Lee | H01L 31/048 |

FOREIGN PATENT DOCUMENTS

| | | |
|---|---|---|
| KR | 10-2037120 B1 | 10/2019 |
| KR | 10-2020-0034100 A | 3/2020 |
| KR | 10-2081776 B1 | 4/2020 |
| KR | 10-2154030 B1 | 9/2020 |
| KR | 10-2176239 B1 | 11/2020 |
| KR | 10-2020-0142457 A | 12/2020 |
| KR | 10-2185429 B1 | 12/2020 |
| KR | 10-2021-0083721 A | 7/2021 |
| KR | 10-2021-0094258 A | 7/2021 |

\* cited by examiner

SOLAR PANEL DISASSEMBLING APPARATUS

CROSS-REFERENCE TO RELATED APPLICATION(S)

This application claims priority to Korean Patent Application No. 10-2021-0105656 filed on Aug. 10, 2021, in the Korean Intellectual Property Office (KIPO), the entire disclosure of which is incorporated by reference herein.

BACKGROUND

1. Field of the Invention

The present disclosure relates to a solar panel disassembling apparatus for disassembling a solar panel (which is the part left after the exterior such as a frame is separated from a common solar module) and, more particularly, to a solar panel disassembling apparatus that can precisely disassemble a solar panel into a glass plate and remaining film type stack that is not the glass plate.

2. Description of the Related Art

This invention was made with government support under National Research and Development program of South Korea (Project identification No. 1485017207; Project Serial No. 2020003100003; Research Administration Authority: Korea Environmental Industry & Technology Institute (KEITI), Research Program Title: R&D Project for recyclability of non-recyclable products; Research Project Title: Development of technology for collecting, shattering and recycling- recovery of valuable materials from end of life photovoltaic panel; Contribution Rate: 100%; Project Performing Agency Name: WonKwang S&T Co., Ltd.; Period of Research: May. 21, 2020 to Dec. 31, 2022) awarded by Korea Ministry of Environment(MOE).

The development of clean energy that reduces environment pollution is being accelerated. Development of clean energy is in progress in various ways including national support projects. Clean energy technology variously includes not only a technology of managing produced power such as energy management, delivery, and storage, but a renewable energy technology that uses biomass, etc. Solar photovoltaic power generation, wind power generation, etc. that generate power using natural force without using the fossil fuel have been continuously studied as power production technologies.

In particular, solar photovoltaic power generation has been remarkably improved in power generation efficiency through continuous improvement of the technology since development, and accordingly, it is considered as a spotlighted alternative energy technology even at present. Solar photovoltaic power generation facilities are continuously increasing because there is the advantage that they can be easily applied even to places where conventional power generation facilities, etc. are difficult to install, they hardly cause environmental damage, and it is possible to use existing buildings, facilities, etc. when installing them.

However, a solar photovoltaic power generation facility also has a problem with maintenance because a solar cell has to be replaced and discarded when its lifespan is ended. In particular, as not only the number, but the application unit or area of solar photovoltaic power generation facilities are increased, it is required to replace and discard solar cells in large quantities. However, most solar photovoltaic power generation facilities are aggregate of photovoltaic modules formed by combining a solar cell to a frame. Further, since photovoltaic modules have a structure in which a glass plate, etc. are bonded to solar cells, they are difficult to simply discard, which is a considerable problem in management of solar photovoltaic power generation facilities in a large scale.

In particular, it is considerably difficult to disassemble and dispose of a solar panel (which is an inner panel comprised of a glass plate and a film type stack including solar cells stacked on the glass plate) which is left after the exterior is removed when a solar module is discarded. Even if an exterior such as a frame is appropriately removed, it is difficult to cleanly remove the film type stack bonded to the glass plate and a problem that the glass plate is damaged due to an inappropriate process is easily generated. Accordingly, measures for solving this problem are continuously required.

SUMMARY

The present disclosure has been made in an effort to solve the problems and an objective of the present disclosure is to provide a solar panel disassembling apparatus that can precisely disassemble a solar panel into a glass plate and a film type stack.

The object of the present disclosure is not limited to those described above and other objects may be made apparent to those skilled in the art from the following description.

A solar panel disassembling apparatus according to the present disclosure is configured to separate a glass plate by removing a stacked film from a solar panel comprised of the glass plate and the stacked film including solar cells stacked on the glass plate, and includes: a supporting plate that supports the bottom of a solar panel so that the top surface thereof is in contact with a glass plate; a moving scraper module that includes a first body connected to a guide and moving in parallel with the supporting plate, a first elevator coupled to the first body to be movable up and down and moving up and down perpendicular to the movement direction of the first body, and a blade disposed over the supporting plate, connected to the first elevator, and changing in height with respect to the supporting plate when the first elevator is operated, and that scrapes the stacked film using the blade while moving forward in parallel with the supporting plate; and a moving pressing module that includes a second body connected to a guide and moving in parallel with the supporting plate, a second elevator coupled to the second body to be movable up and down and moving up and down perpendicular to the movement direction of the second body, and a pressing unit disposed over the supporting plate, connected to the second elevator, and changing in height with respect to the supporting plate when the second elevator is operated, that is disposed forward in the forward movement direction of the moving scraper module, and that presses and aligns the stacked film using the pressing unit ahead of the moving scraper module when the moving scraper module is moved forward.

The moving pressing module may further include a heating unit that induces thermal deformation of the stacked film by heating the outer surface of the stacked film.

The pressing unit may include a plurality of supporting rollers spaced apart from each other in rolling contact with the outer surface of the stacked film, and the heating unit may be a heater that radiates heat to a space between the supporting rollers in the pressing unit.

The heater may discharge at least any one of infrared beams or hot wind.

The moving scraper module may further include a temperature adjuster that increases the temperature of the blade by heating the blade.

The solar panel disassembling apparatus may further include: a load cell that is disposed under the solar panel at a start position where the blade starts to come in contact with the solar panel; and a controller that brings the blade in close contact with the solar panel by moving down the first elevator at the start position and that adjusts the position of the blade by controlling the operation of the first elevator in accordance with at least any one of magnitude and a variation of load sensed by the load cell.

The solar panel disassembling apparatus may further include a gap control rod that is disposed between the moving scraper module and the moving pressing module and forms a slit for passing the stacked film between the blade and the pressing unit by adjusting a gap such that the blade and the pressing unit are close to but not in contact with each other.

The solar panel disassembling apparatus may further include a bending pressing plate that is disposed at the end of the pressing unit which faces the blade, and deforms the stacked film, which has passed through the slit, into a stacked film coil by pressing the film stacked with a curved surface.

The first body may be connected to at least two pairs of guide bars that are in parallel with the supporting plate and spaced apart from each other, one of which disposed higher than the blade and the other disposed lower than the blade.

A plurality of moving pressing modules that can be separably coupled to each other may be continuously disposed forward in a forward movement direction of the moving scraper module.

DETAILED DESCRIPTION

Figure 1:
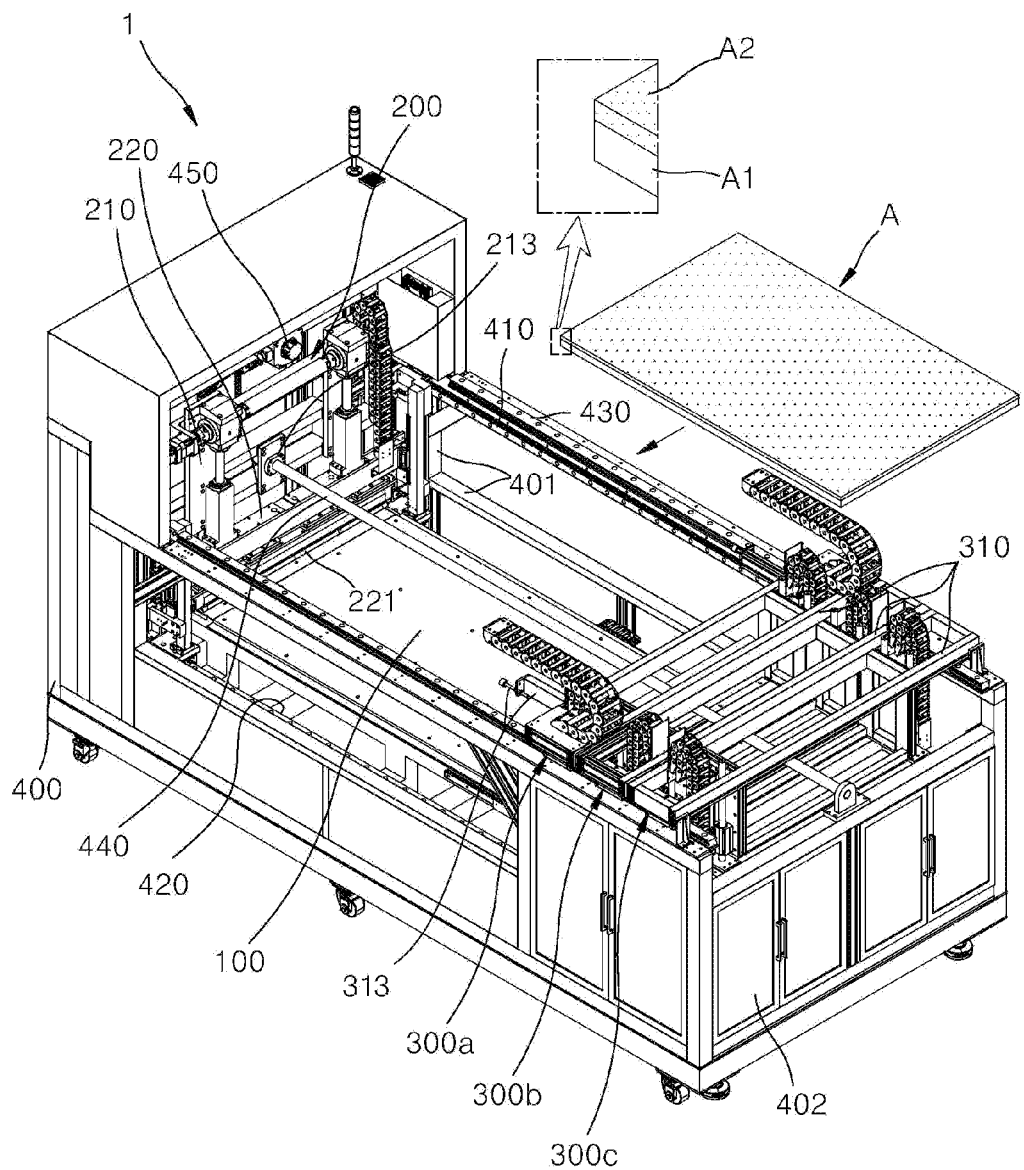
FIG. 1 is a perspective view of a solar panel disassembling apparatus according to an embodiment of the present disclosure.

The advantages and features of the present disclosure, and methods of achieving them will be clear by referring to the exemplary embodiments that will be described hereafter in detail with reference to the accompanying drawings. However, the present disclosure is not limited to the exemplary embodiments described hereafter and may be implemented in various ways, and the exemplary embodiments are provided to complete the description of the present disclosure and let those skilled in the art completely know the scope of the present disclosure and the present disclosure is defined by claims. Like reference numerals indicate the same components throughout the specification.

Hereafter, a solar panel disassembling apparatus according to the present disclosure is described in detail with reference to FIGS. 1 to 9.

Figure 2:
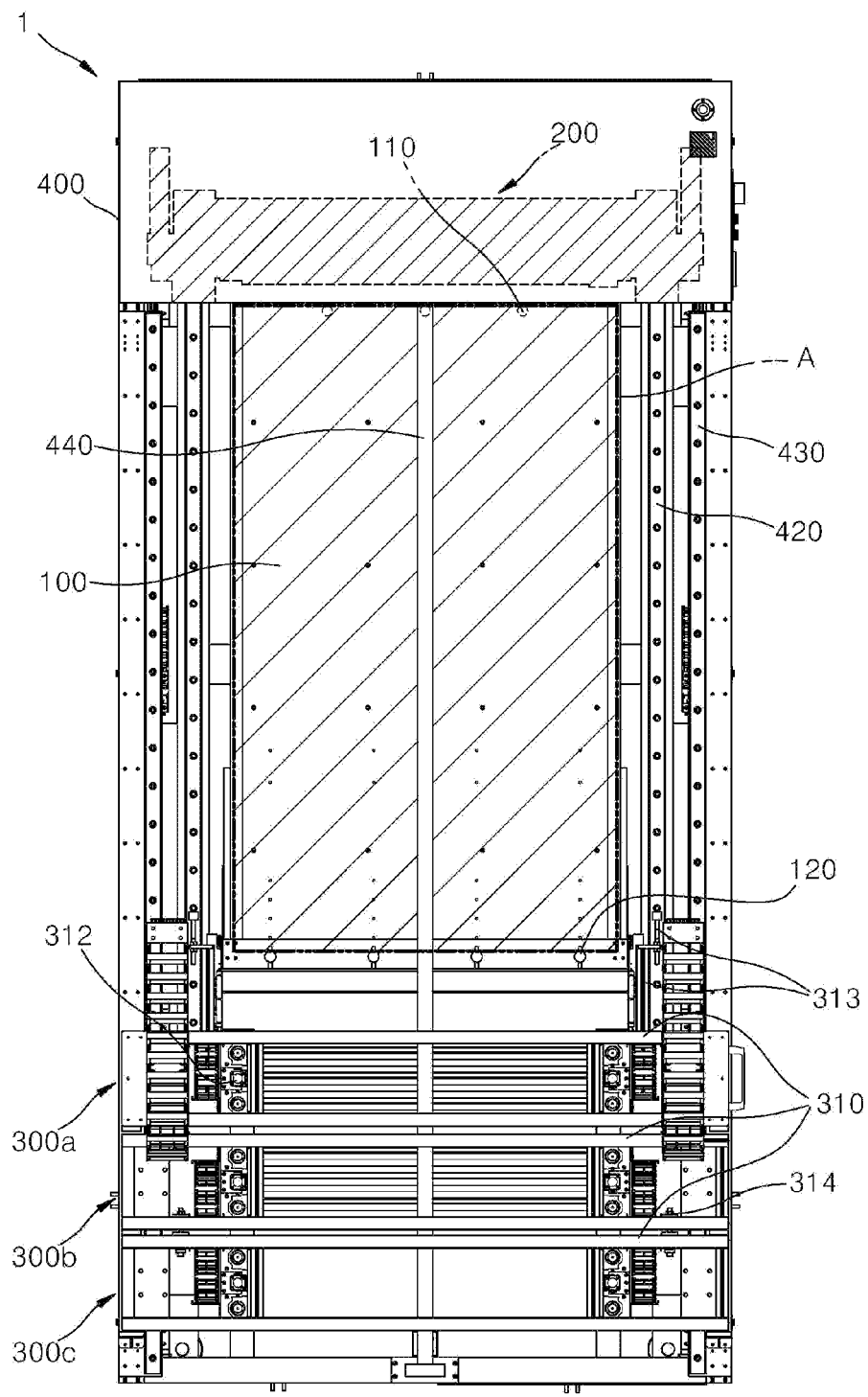
FIG. 2 is a plan view of the solar panel disassembling apparatus of FIG. 1.
Figure 3:
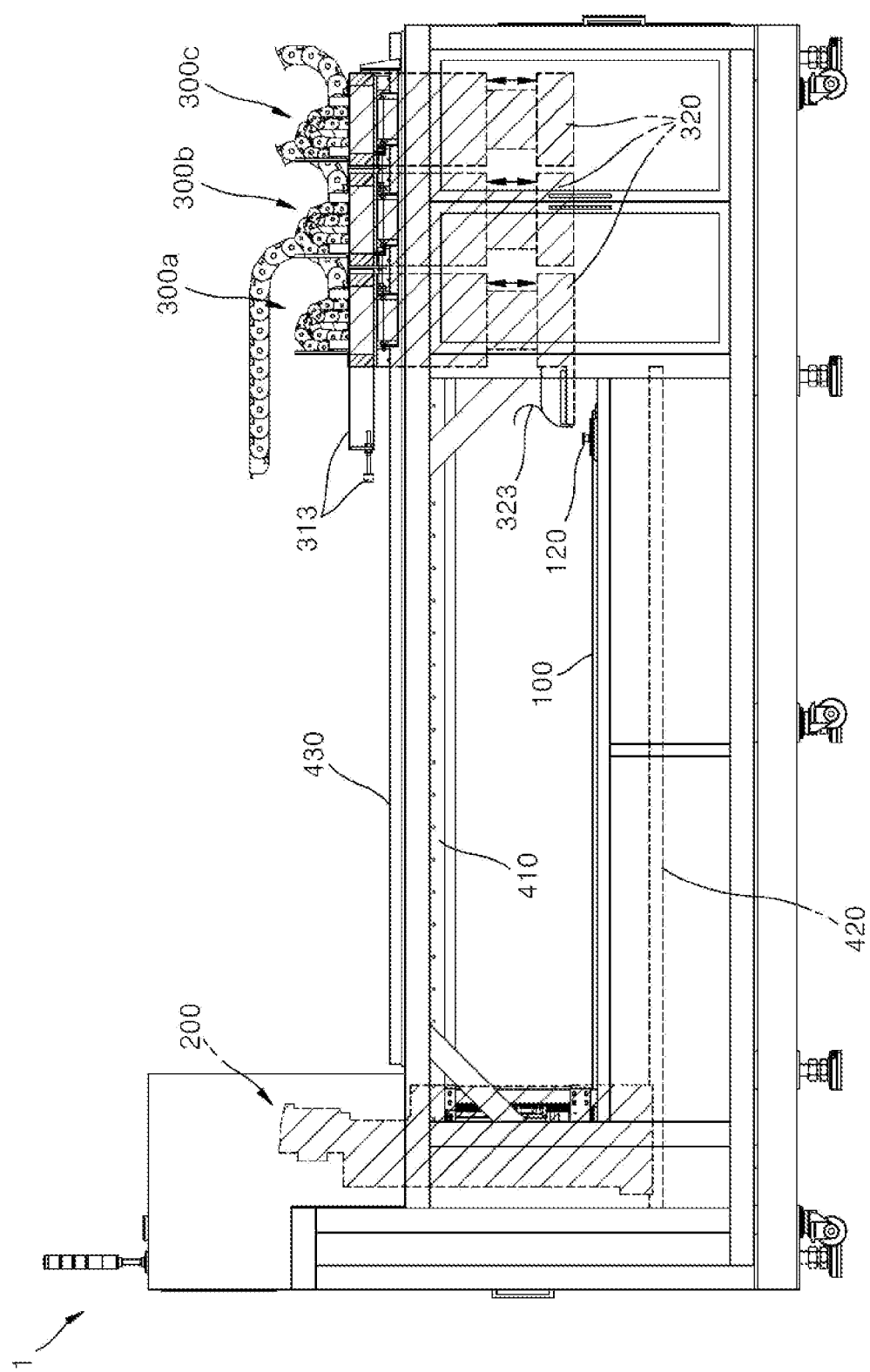
FIG. 3 is a side view of the solar panel disassembling apparatus of FIG. 1.

FIG. 1 is a perspective view of a solar panel disassembling apparatus according to an embodiment of the present disclosure, FIG. 2 is a plan view of the solar panel disassembling apparatus of FIG. 1, and FIG. 3 is a side view of the solar panel disassembling apparatus of FIG. 1.

Referring to FIGS. 1 to 3, a solar panel disassembling apparatus 1 according to the present disclosure includes a supporting plate 100, a moving scraper module 200 moving in parallel along the supporting plate 100, and moving pressing modules 300a, 300b, and 300c. A solar panel A that is the target to be disassembled is mounted on the supporting plate 100, and the moving scarper module 200 and the moving pressing modules 300a, 300b, and 300c separately move and come in contact with the solar panel A. The moving scraper module 200 scrapes out the portion (i.e., a stacked film A2) that is not a glass plate A1 of the solar module A using a blade 221, and the moving pressing modules 300a, 300b, and 300c align the portion (stacked film A2) ahead of the moving scraper module 200. Accordingly, the solar panel A formed by bonding the glass plate A1 and the stacked film A2 that is not the glass plate can be cleanly disassembled into two parts by the interaction of the moving pressing modules 300a, 300b, and 300c and the moving scraper module 200.

The moving pressing modules 300a, 300b, and 300c can induce deformation of the stacked film A2 using heat while pressing the stacked film A2 of the solar panel A. Accordingly, the bonding between the glass plate A1 and the stacked film A2 can be weakened in advance. In addition, the height of the blade 221 is precisely adjusted, so the blade 221 can accurately cut the bonding portion between the glass plate A1 and the stacked film A2. The solar panel A having a layered structure having a bonding surface can be more accurately and conveniently disassembled by a combination of those effects.

The solar panel disassembling apparatus 1 of the present disclosure is configured as follows. The solar panel disassembling apparatus 1, which is configured to separate a glass plate A1 by removing a stacked film A2 from a solar panel A comprised of the glass plate A1 and the stacked film A2 including solar cells stacked on the glass plate, includes: a supporting plate 100 that supports the bottom of a solar panel so that the top surface thereof is in contact with a glass plate; a moving scraper module 200 that includes a first body 210 connected to a guide and moving in parallel with the supporting plate 100, a first elevator 220 coupled to the first body 210 to be movable up and down and moving up and down perpendicular to the movement direction of the first body 210, and a blade 221 disposed over the supporting plate 100, connected to the first elevator 220, and changing in height with respect to the supporting plate 100 when the first elevator 220 is operated, and that scrapes the stacked film A2 using the blade 221 while moving forward in parallel with the supporting plate 100; and moving pressing modules 300a, 300b, and 300c that includes a second body 310 connected to a guide and moving in parallel with the supporting plate 100, a second elevator (see 320 in FIG. 3) coupled to the second body 310 to be movable up and down and moving up and down perpendicular to the movement direction of the second body 310, and a pressing unit (see 321 in FIGS. 6 and 7) disposed over the supporting plate 100, connected to the second elevator 320, and changing in height with respect to the supporting plate 100 when the second elevator 320 is operated, that is disposed forward in the forward movement direction of the moving scraper module 220, and that presses and aligns the stacked film A2 using the pressing unit 321 ahead of the moving scraper module when the moving scraper module 200 is moved forward.

According to an embodiment of the present disclosure, the plurality of moving pressing modules 300a, 300b, and 300c may be separably coupled to each other and may be continuously disposed forward in the forward movement direction of the moving scraper module 200, and each may include a heating unit (see 322 in FIGS. 6 and 7) that induces thermal deformation of the stacked film A2 by heating the outer surface of the stacked film A2. The moving scraper module 200 may further include a temperature adjuster (see 222 in FIGS. 4 and 5) that increases the temperature of the blade 221 by heating the blade 221.

According to an embodiment of the present disclosure, the solar panel disassembling apparatus 1 may further include: a load cell (see 110 in FIGS. 4 and 5) that is disposed under the solar panel A at a start position where the blade 221 starts to come in contact with the solar panel A; and a controller (see 500 in FIGS. 4 and 5) that brings the blade 221 in close contact with the solar panel A by moving down the first elevator 220 at the start position and that adjusts the position of the blade 221 by controlling the operation of the first elevator 220 in accordance with at least any one of the magnitude and the variation of load sensed by the load cell 110. The configuration, operation effect, etc. of the present disclosure are described hereafter in more detail on the basis of the embodiment of the present disclosure.

First, the solar panel A that is the target to be disposed of in the present disclosure is briefly described with reference to FIG. 1. The solar panel A may be a part left after the exterior such as a frame (a bar-shaped protection structure coupled to the edge of a solar module) and a junction box (a structure for cable connection attached to the outer side of a stacked film, that is, the rear surface of a solar module) is removed from a common solar module. The solar panel A, which is the part where power is actually generated in a solar module, may be comprised of a stacked film A2 including solar cells, and a glass plate A1 supporting the stacked film A2. The solar panel A may be a panel having an entirely rectangular shape and the cross-section thereof may be a layered structure including the glass plate A1 and the stacked film A2 including solar cells stacked on the glass plate A1. The solar panel A may be largely divided into a layer of the glass plate A1 and a layer of the stacked film A2 bonded to the layer of the glass plate A1. Solar cells are included in the stacked film A2, and an encapsulation film, a back sheet, etc. that are disposed on both sides of the solar cell may be included together in addition to the solar cells. The solar panel disassembling apparatus 1 of the present disclosure is an apparatus that disassembles the solar panel A into the glass plate A1 and the stacked film A2.

The solar panel disassembling apparatus 1 may include a housing 400 as a supporting structure. Other components of the present disclosure may be disposed in the housing 400. The housing 400, for example, may be formed by combining metallic frames, metallic plates, or the like, and may provide a base or a frame that supports other components. The housing 400 may be partially open and closed to take in and out an object and to protect the inside. For example, an opening 401 for taking in and out the solar panel A or the glass plate A1 left after disassembling may be formed on a side of the housing 400, and a door 402 or the like for discharging a stacked film coil (see A2-1 in FIG. 9) produced after disassembling may be formed on the other side. The housing 400 is not necessarily limited to this shape, so it can be modified in various shapes, if necessary.

One or more guides may be disposed at the housing 400. The guide can guide movement of the moving scraper module 200 and the moving pressing modules 300a, 300b, and 300c and can determine the movement directions of them. The forward movement direction to be described below may be a direction that is parallel with the guide. For example, the guide may include a third guide bar 430 disposed at the top of the housing 400, a first guide bar 410 disposed slightly lower than or at the same height as the third guide bar 430, and a second guide bar 420 disposed at a lower portion lower than the third guide bar 430 in the housing 400. The guide bars each may be disposed at least in a pair. The guide bars are arranged in the same direction, as shown in the figures.

A driving structure that provides power to the moving scraper module 200 and the moving pressing modules 300a, 300b, and 300c may be formed using the housing 400. When the driving structure is formed by combining a plurality of components, some of the components may be disposed in the housing 400. For example, the driving structure may include a driving shaft 440 disposed across the housing 400 and in parallel with the guide. The driving shaft 440 is coupled to a driving block 213 of the moving scraper module 220, whereby a linear actuator such as a ball screw can be configured (in this case, a thread may be formed on the driving shaft and ball bearing engaging with the thread may be formed at the driving block). The driving motor 450 disposed in the housing 400 can move the moving scraper module 200 in parallel with the driving shaft 440 by rotating the driving shaft 440 (in this case, a power transmission device such as a belt, a chain, etc. may be used). The moving pressing modules 300a, 300b, and 300c can be moved together by the driving force provided to the moving scraper module 200. However, the present disclosure is not necessarily limited to this configuration, and the way of supplying power to the moving scraper module 200 and the moving pressing modules 300a, 300b, and 300c may be freely changed.

The supporting plate 100 is horizontally disposed in the housing 400. The top of the supporting plate 100 is formed to be flat. The supporting plate 100 may be installed low close to the bottom of the housing 400 and may be positioned close to the opening 401 described above (see FIG. 3, etc.). The supporting plate 100 supports the bottom of the solar panel A so that the top surface thereof is in contact with the glass plate A1. That is, the solar panel A is horizontally mounted on the supporting plate 100 with the glass plate A1 facing down and the stacked film A2 facing up. This situation is exemplified in FIG. 1, and the solar panel A mounted on the supporting plate 100 may overlap the supporting plate 100, as shown in FIG. 2.

Referring to FIG. 2, a load cell (see 110 in FIG. 2) to be described below may be disposed at a first end of the supporting plate 100. A stopper (see 120 in FIGS. 2 and 3) that fixes the solar panel A may be disposed at a second end of the supporting plate 100. The moving scraper module 200 can move forward in close contact with the solar panel A at least from the first end of the supporting plate 100 where the load cell 110 is positioned to the second end of the supporting plate 100 where the stopper 120 is positioned (see FIG.

8). Accordingly, such direction is the forward movement direction of the moving scraper module 200 (indicated by the arrow towards the right side in FIG. 8). The moving pressing modules 300a, 300b, and 300c also move forward in the same direction in close contact with the solar panel A and are positioned ahead of the moving scraper module 200 in the forward movement direction (i.e., further ahead in the forward movement direction). The moving scraper module 200, as shown in FIGS. 2 and 3, can fully move back outside the supporting plate 100 before operating, and accordingly, can prepare the moving pressing modules 300a, 300b, and 300c by pushing them to the first end of the supporting plate 100. That is, before starting to operate, the moving pressing modules 300a, 300b, and 300c are moved right in front of the moving scraper module 200 shown in FIG. 2, whereby they can be prepared substantially in close contact with the moving scraper module 200. The detailed operation will be described in more detail below.

Referring to FIG. 1, the moving scraper module 200 includes: a first body 210 connected to a guide and moving in parallel with the supporting plate 100; a first elevator 220 coupled to the first body 210 to be movable up and down and moving up and down perpendicular to the movement direction of the first body 210; and a blade 221 disposed over the supporting plate 100, connected to the first elevator 220, and changing in height with respect to the supporting plate 100 when the first elevator 220 is operated. The moving scraper module 200 having this configuration scrapes out the stacked film A2 from the solar panel A using the blade 221 while moving forward in parallel with the supporting plate 100 (see the enlarged view of FIG. 8). In more detail, the moving scraper module 200 can disassemble the solar panel A into two part by cutting the bonding position between the glass plate A1 and the stacked film A2 using the blade 221. Hereafter, the operation of moving scraper module 200 is described in more detail with reference to FIGS. 4 and 5.

Figure 4:
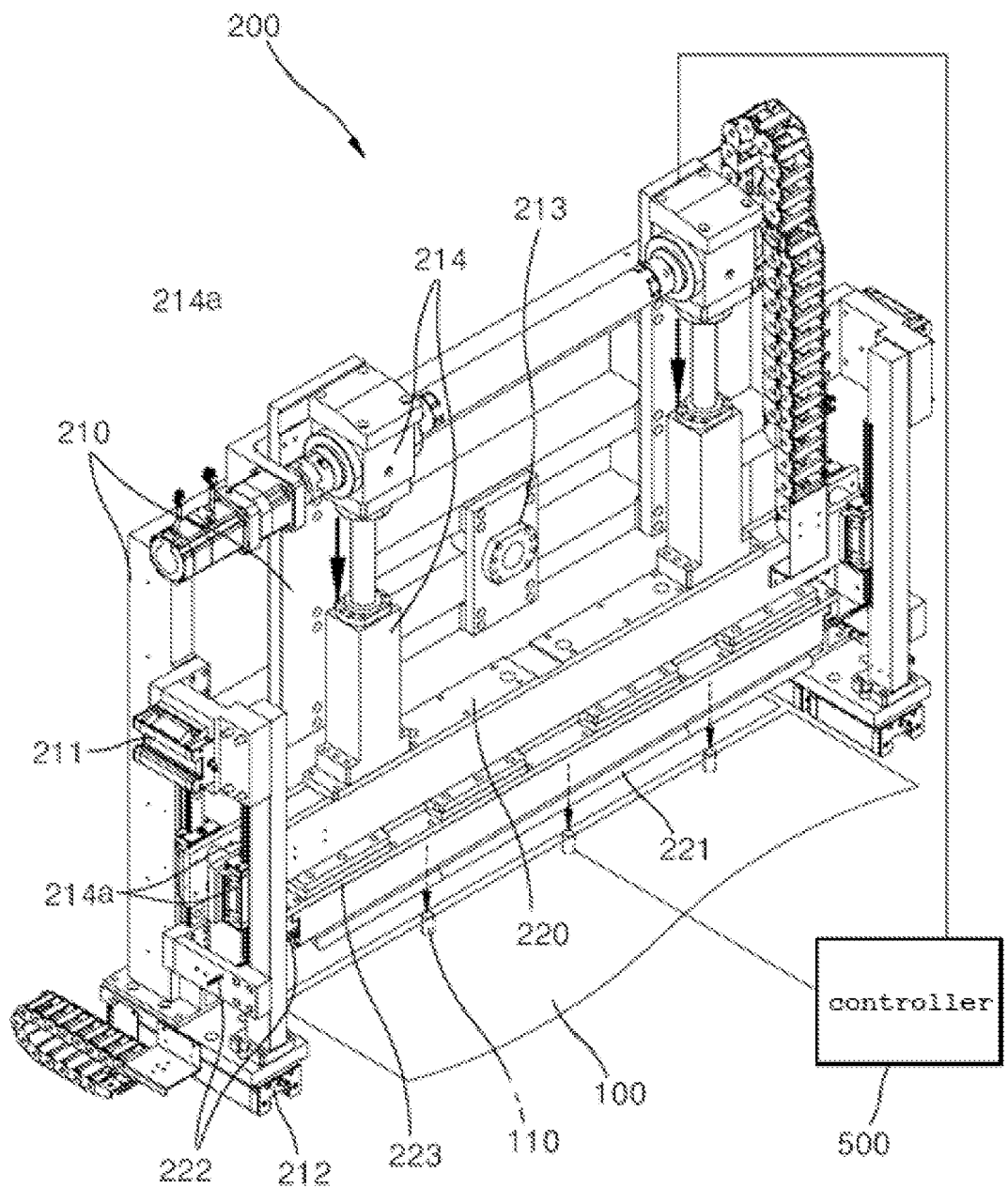
FIG. 4 is an enlarged view of a moving scraper module of the solar panel disassembling apparatus of FIG. 1.
Figure 5:
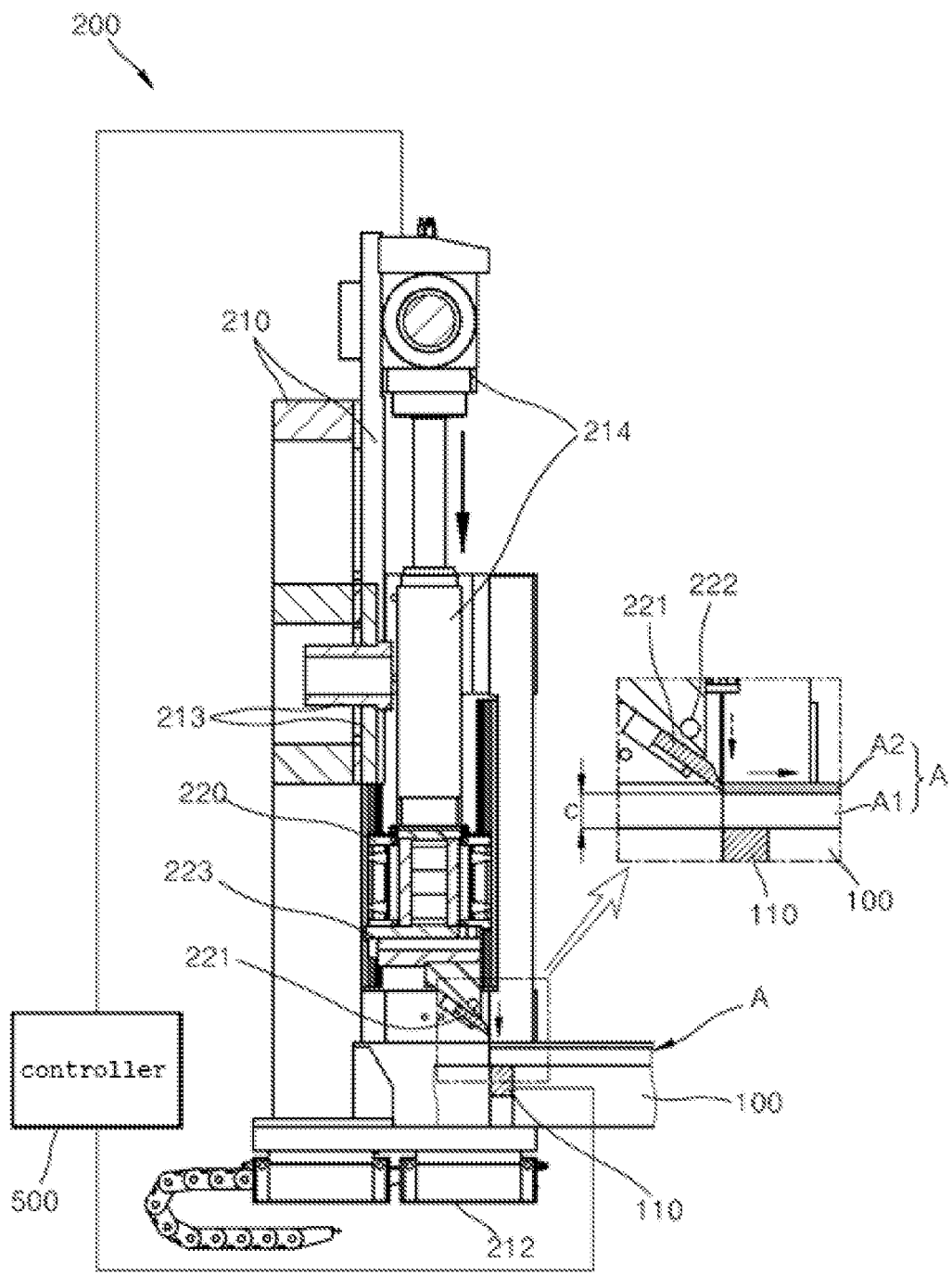
FIG. 5 is an operation view showing the moving scraper module of FIG. 4 together with a solar panel.

FIG. 4 is an enlarged view of a moving scraper module of the solar panel disassembling apparatus of FIG. 1, and FIG. 5 is an operation view showing the moving scraper module of FIG. 4 together with a solar panel. The moving scraper module is shown in a cross-sectional view in FIG. 5.

The first body 210 of the moving scraper module 200 is connected to the guide described above and moves in parallel with the supporting plate 100. The first body 210, for example, may be a structure such as a metallic frame and can support the first elevator 220 and the blade 221 connected to the first elevator 220 on the guide such that the first elevator 220 and the blade 221 can move up and down. The first body 210 may have various shapes and structures that can move along the guide. Accordingly, the first body 210 may be changed in various shapes other than the shape shown in FIG. 4. A chain-shaped cable guide for wiring, etc. may be disposed on the outer surface of the moving scraper module 200.

The first body 210 moves in parallel with the supporting plate (see 100 in FIG. 3) and applies pressure in the same direction to push the blade 221 between the glass plate (see A1 in FIG. 1) and the stacked film (see A2 in FIG. 1). Accordingly, it is possible to increase the structural stability by connecting the first body to at least two pairs of different guide bars. For example, the first body 210 may be connected to at least two pairs of guide bars that are in parallel with the supporting plate 100 and spaced apart from each other, one of the pairs disposed higher than the blade 221 and the other disposed lower than the blade 221.

The first body 210 may be slidably coupled to the first guide bar (see 410 in FIGS. 1 and 3) through a first slider 211 formed at a side, and may be slidably coupled to the second guide bar (see 420 in FIGS. 1 and 3) through a second slider 212 formed at another side. As described above, the guide bars may be formed in pairs, and each sliders formed at the first body 210 may also be formed in pairs at positions corresponding thereto. In particular, as shown in the figures, the first slider 211 is disposed over the blade 221 and the second slider 212 is disposed under the blade 221, so supporting points that support the first body 210 (or supporting points that support the blade in the same way) may be formed over and under the blade 221 by the first guide bar 410 and the second guide bar 420 coupled to the sliders, respectively. Accordingly, the blade 221 can be very stably fixed while the blade moves into between the stacked film A2 and the glass plate A1.

The first elevator 220 is coupled to the first body 210 to be movable up and down. The blade 221, as shown in the figure, is disposed over the supporting plate 100 and connected to the first elevator 220, so the height of the blade 220 changes with respect to the supporting plate 100 when the first elevator 220 is operated. That is, the blade 221 is fixed to the first elevator 220 and changes in height together with the first elevator 220. The first elevator 220 may also be a structure such as a metallic frame and may be formed in various shapes that can fix the blade 221. For example, a first elevation actuator 214 that vertically contracts and stretches (i.e., perpendicular to the supporting plate horizontally disposed) may be disposed between the first elevator 220 and the first body 210, so it is possible to change the heights of the first elevator 220 and the blade 221 by contracting and stretching the first elevation actuator 214. The first elevation actuator 214, for example, may be a linear actuator having a structure of which both ends change in length, and the linear actuator, for example, may be achieved in various types such as a ball-screw device coupled to a stepping motor and a hydraulic cylinder. If necessary, a first elevation guide 214a (e.g., which may be comprised of a vertical guide and a slider coupled thereto) that guides vertical movement may be disposed between the first body 210 and the first elevator 220, thereby being able to increase stability of elevation.

The blade 221 may be disposed at an appropriate position on the first elevator 220. For example, when the entire first elevator 220 is positioned over the supporting plate 100, the blade 221 may be disposed at the lower end of the first elevator 220. This structure is shown in this embodiment. In more detail, the blade 221 may protrude at an angle from the lower end of the first elevator 220, and the end thereof may be machined to be pointed. The blade 221 may be firmly coupled to the first elevator 220 not to shake. The blade 221 may be a high-strength metallic blade, etc. A temperature adjuster 222 that increases the temperature of the blade 221 by heating the blade 221 may be disposed at a side of the blade 221, whereby it is possible to scrape the stacked film A2 with the blade 221 heated. The temperature adjuster 222, for example, may be a heating wire disposed close to the blade 221, and this structure makes it possible to effectively heat the entire blade 221. An insulator 223 made of an insulating material may be disposed at a necessary portion such as between the temperature adjuster 222 and the first elevation actuator 214, whereby it is possible to prevent an unnecessary temperature increase of other portions other than the blade 221.

In particular, the height of the blade 221 can be very precisely adjusted by the load cell 110 that senses load. Specifically, the load cell 110 is disposed under a solar panel (see A in FIG. 5) at a start position where the blade 221 starts to come in contact with the solar panel A. Further, there may be provided a controller 500 that brings the blade 221 in close contact with the solar panel A by moving down the first elevator 220 from the start position in cooperation with the load cell 110 and that adjusts the position of the blade 221 by controlling the operation of the first elevator 220 in accordance with at least any one of the magnitude and the variation of load sensed by the load cell 110. The controller 500 may be connected to the load cell 110 such that electrical signals can be transmitted therebetween, and may also be connected to the first elevation actuator 214 such that electrical signals can be transmitted therebetween. This connection includes both of wired connection and wireless connection. The controller 500, for example, may be a computer device including a Central Processing Unit (CPU), and the computer device may include a Programmable Logic Controller (PLC), etc. The controller 500 may be installed at an appropriate position in the housing.

Since the start position is the position where the blade 221 starts to come in contact with the solar panel A, it may be the same as the position where disassembling is started. Referring to FIG. 5, the start position, for example, may be a position where the blade 221 comes in contact with an end of the solar panel A or slightly overlaps the end. The start position is a position where the blade 221 can press the solar panel A when moving down, and may be the outermost position of the solar panel A. The start position can be artificially determined as a position where disassembling is started, so it may be appropriately changed, if necessary. However, in any case, the blade 221 can come in contact with the solar panel A at the start position. The load cell 110 is disposed under the solar panel A at the start position. The load cell 110 may be positioned at the same height as the supporting plate 100 and may be installed at an end of the supporting plate 100. For example, it may be possible to form a space by partially cutting the supporting plate 100 and dispose the load cell 100 in the space to be in contact with the solar panel A.

Accordingly, the load cell 110 can immediately sense load applied from above the solar panel A and a change of the load while being in contact with the bottom of the solar panel A. The operation of adjusting the position of the blade 221 by the load cell 110 and the controller 500 is described in more detail hereafter with reference to FIG. 5. First, the moving scraper module 200 can move along the guide to the start position. FIG. 5 shows the moving scraper module 200 at the start position. However, this operation is not necessary, and may not be needed depending on situations. For example, when the retreat position (e.g., the position in FIG. 2) is different from the start position (i.e., when the blade does not immediately come in contact with the solar panel even though it moved down), this prior operation may be required. However, when the retreat position is appropriate and the same as the start position, it is possible to bring the blade 221 in contact with the solar panel A by immediately moving down the blade 221, so there is no need for a specific prior operation. It is possible to perform the prior operation or not by appropriately considering various situations, for example, when the size of the solar panel A is partially changed or the movable range of the moving scraper module 200 is relatively large.

Since the blade 221 can come in contact with an end of the solar panel A at the start position, the controller 500 moves down the first elevator 220 at the start position, as shown in FIG. 5. The controller 500 can move down the first elevator 220 by stretching the first elevation actuator 214. Accordingly, the blade 221 connected to the first elevator 220 presses the solar panel A to apply pressure, which results in a change in the load value that the load cell 110 senses. The sensed load is immediately transmitted to the controller 500.

The controller 500 controls the operation of the first elevator 220 in accordance with the transmitted load value. The controller 500 can change the position of the first elevator 220 by transmitting a control signal to the first elevation actuator 214 in accordance with the load value. In particular, the controller controls the operation of the first elevator 220 and adjusts the position of the blade 221 in accordance with at least any one of the magnitude and the variation of the load sensed by the load cell 110. The blade 221 comes in contact with the outer surface of the stacked film A2 first and gradually comes close to the glass plate A1 while moving down. The blade 221 easily passes through the section corresponding to the stacked film A2 where density is low and deformation is easy, but receives large resistance as it comes close to the glass plate A1. Accordingly, the more the blade 221 comes close to the glass plate A1, the more the load sensed by the load cell 110 rapidly increases and the more the variation of the load quickly increases. Accordingly, the controller 500 can stop moving down the first elevator 220 and stop the blade 221 at the corresponding position, for example, when the load sensed by the load cell 110 reaches a set value or the variation (e.g., per unit time) of the load reaches a set value.

The controller 500, for example, may have a control program that performs the control operation through corresponding calculation therein. The controller 500 can perform the control by loading the control program. It is possible to very accurately position the blade 221 on the surface of the glass plate A1 by appropriately setting the upper limit of at least any one of the magnitude and variation of load. For example, it is possible to accumulate in advance data through tests on several solar panels A and derive appropriate set values from the data. It is also possible to update appropriate set values in an adaptable manner with data obtained through repeated work. Through this control, as shown in FIG. 5, the blade 221 can be stopped with the end thereof actually moved up by the thickness C of the glass plate A1 from the supporting plate 100.

The moving scraper module 200, as described above, adjusts the height of the blade 221 at the start position, and cuts the stacked film A2 while immediately moving in parallel with the supporting plate 100. Adjusting the height of the blade 221 and moving forward the blade 221 can be actually continuously performed without stop. Even if the prior operation for moving from the retreat position to the start position shown in FIG. 5 is required, a corresponding operation can be continuously performed. Accordingly, the moving scraper module 200 can perform the operation of moving down the blade 221 to the surface of the glass plate A1 and scraping the stacked film A2 while moving forward through one sequence while actually moving. The moving scraper module 200 can be operated in this way. The operation of the entire apparatus including the above operation will be described again in detail below.

The moving pressing modules 300a, 300b, and 300c are described with reference to FIGS. 1 to 3. First, the entire arrangement structure of the moving pressing modules 300a, 300b, and 300c is described. The moving pressing modules 300a, 300b, and 300c include a second body 310 connected to a guide and moving in parallel with the supporting plate 100, a second elevator (see 320 in FIG. 3) coupled to the second body 310 to be movable up and down and moving up and down perpendicular to the movement direction of the second body 210, and a pressing unit (see 321 in FIGS. 6 and 7) disposed over the supporting plate 100, connected to the second elevator 320, and changing in height with respect to the supporting plate 100 when the second elevator 320 is operated. Further, the moving pressing modules 300a, 300b, and 300c are disposed forward in the forward movement direction of the moving scraper module 200 (in the direction of the arrow in right in FIG. 8). According this configuration, when the moving scraper module 200 is moved forward, it is possible to align a stacked film (see A2 in FIG. 1) by pressing the stacked film using the pressing unit 321 ahead of the moving scraper module 200. In detail, the moving pressing modules 300a, 300b, and 300c can be connected and moved with the third guide bar 430 of the guides described above, and as shown in the figures, a plurality of moving pressing modules may be continuously disposed forward in the forward movement direction of the moving scraper module 200.

Figure 6:
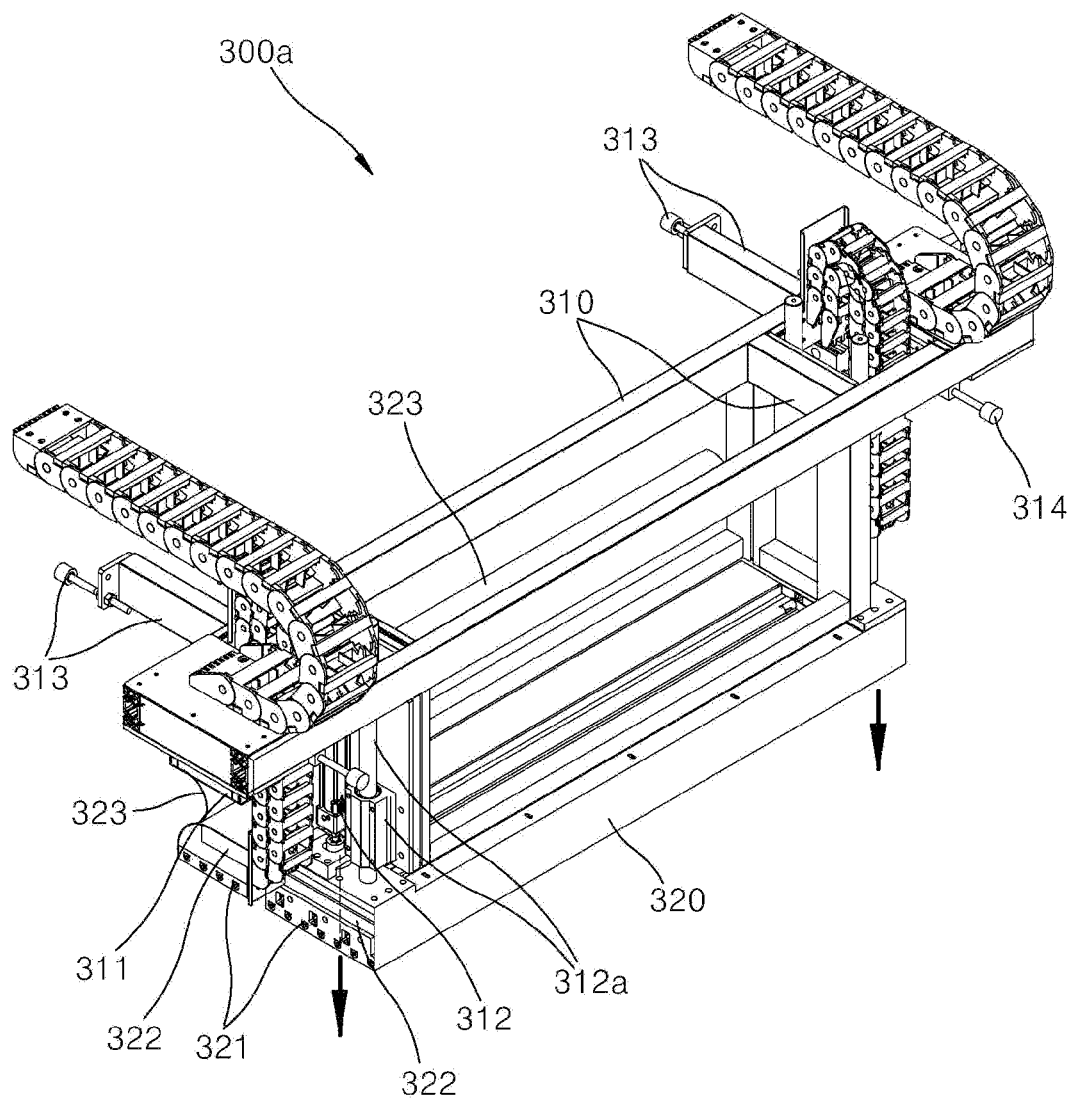
FIG. 6 is an enlarged view of a moving pressing module of the solar panel disassembling apparatus of FIG. 1.
Figure 7:
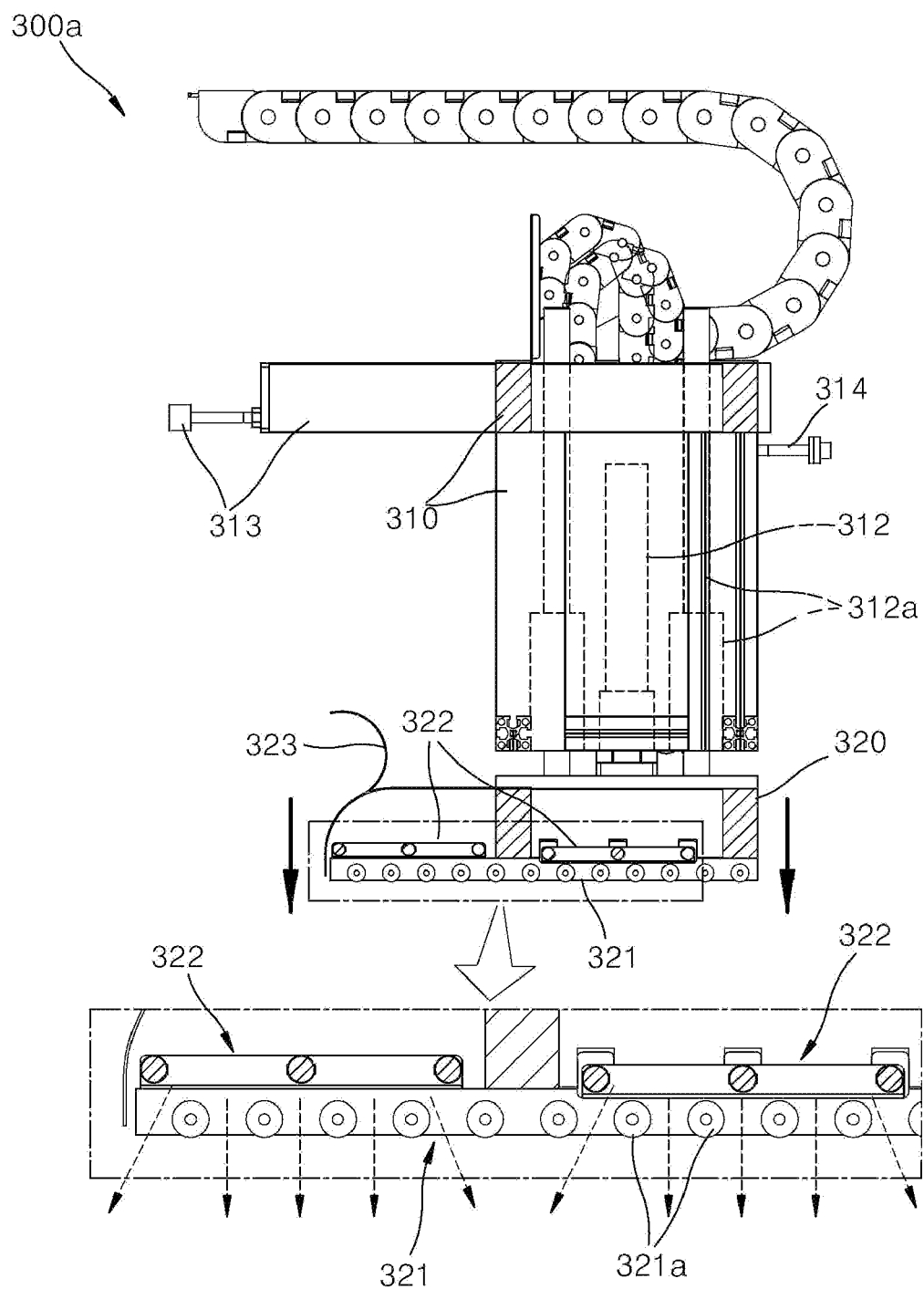
FIG. 7 is a cross-sectional view showing the internal structure of the moving pressing module of FIG. 6.

The moving pressing modules 300a, 300b, and 300c are substantially the same in that each of them includes a second body 310, a second elevator 320, and a pressing unit (see 321 in FIGS. 6 and 7). Further, they are substantially the same also in that they include a heating unit (see 322 in FIGS. 6 and 7) that guides thermal deformation of the stacked film A2 by heating the outer surface of the stacked film A2. However, any one moving pressing module 300a that are closest to the moving scraper module 200 may be partially different in that it includes a bending pressing plate (see 323 in FIG. 3) and a gap control rod (see 313 in FIGS. 1 to 3) to adjust the gap from the moving scraper module 200. For example, when a single moving pressing module is provided, the moving pressing module may include the gap control rod 313 and the bending pressing plate 323.

The moving pressing modules 300a, 300b, and 300c may be formed not to be connected to the driving shaft 440 described above, and accordingly, they may not be directly supplied with a driving force from the driving structure. The moving pressing modules 300a, 300b, and 300c are in contact with the moving scraper module 200, so when the moving scraper module 200 is moved forward, they can be pushed by the moving scraper module 200. Accordingly, the forward operations of the moving scraper module 200 and the moving pressing modules 300a, 300b, and 300c are substantially synchronized. However, the present disclosure is not necessarily limited to this configuration, and if necessary, it is possible to move the moving pressing modules 300a, 300b, and 300c by providing a driving force to them. Though not shown, the moving pressing modules 300a, 300b, and 300c may be connected to each other through a chain, etc., and accordingly, they can move together even when they move opposite to the forward movement direction. As described above, the moving scraper module 200 can be fully retreated to the position shown in FIG. 2 before it is operated, and the moving pressing modules 300a, 300b, and 300c can be prepared substantially in close contact with the moving scraper module 200 by moving immediately in front of the moving scraper module 200, as shown in FIG. 2. Thereafter, the moving scraper module 200 pushes and moves forward the moving pressing modules 300a, 300b, and 300c together while moving forward.

FIG. 6 is an enlarged view of a moving pressing module of the solar panel disassembling apparatus of FIG. 1, and FIG. 7 is a cross-sectional view showing the internal structure of the moving pressing module of FIG. 6.

The structural features of the moving pressing modules are described in more detail with reference to FIGS. 6 and 7. The actual features of the moving pressing modules are all included in the moving pressing module 300a closest to the moving scraper module of a plurality of moving pressing modules (see 300a, 300b, and 300c in FIGS. 1 to 3), so the detailed structure is described on the basis of the moving pressing module 300a. Other moving pressing modules (300a and 300b in FIGS. 1 to 3) may be considered as equally to include other configuration except for the gap control rod 313 and the bending pressing plate 323.

The second body 310 of the moving pressing module 300a, for example, may be a structure such as a metallic frame. The second body 310 can support the second elevator 320 and the pressing unit 321 connected to the second elevator 320 on the guide such that they can move up and down. The second body 310 may have various shapes and structures that can move along the guide. Accordingly, the first body 210 may be changed in various shapes other than the shape shown in FIG. 6. A chain-shaped cable guide for wiring, etc. may be disposed on the outer surface of the moving pressing module 300a. The second body 310 is slidably coupled to the third guide bar (see 430 in FIGS. 1 to 3) through a third slider 311 formed at a side. Since guide bars are disposed in pairs, the slider bar 311 may also be disposed in pairs at corresponding positions. As described above, since the third guide bar 430 is positioned at the top of the housing 400, a supporting point can be formed at the upper end of the second body 310 by coupling to the third slider 311. This structure is advantageous to pressing and aligning a stacked film (see A2 in FIG. 1) by moving down the pressing unit 321.

The second elevator 320 is coupled to the second body 310 to be movable up and down. The pressing unit 321 is disposed over the supporting plate (see 100 in FIGS. 1 to 3) and connected to the second elevator 320, so the height thereof changes with respect to the supporting plate 100 when the second elevator 220 is operated. That is, the pressing unit 321 is fixed to the second elevator 320 and changes in height together with the second elevator 320. The second elevator 320 may also be a structure such as a metallic frame and may be formed in various shapes that can fix the pressing unit 321. A second elevation actuator 312 that vertically contracts and stretches (i.e., perpendicular to the supporting plate horizontally disposed) may be disposed between the second elevator 320 and the second body 310, so it is possible to change the heights of the second elevator 320 and the pressing unit 321 by contracting and stretching the second elevation actuator 312. The second elevation actuator 312, for example, may be a linear actuator having a structure of which both ends change in length. The linear actuator may be various actuators such as hydraulic cylinder. If necessary, a second elevation guide 312a that guides vertical movement (e.g., it may be comprised of a vertical guide bar and a slider coupled thereto. The second elevation guide has a guide bar coupled to the second elevator and a slider fixed to the second body, whereby the entire guide bar can be moved up and down when the second elevator is moved) is disposed between the second body 310 and the second elevator 320, thereby being able to increase stability of elevation.

If necessary, a shock absorber 314 may be disposed in the forward movement direction of the second body 310. The shock absorber 314 is used to adjust the gaps between each of a plurality of moving pressing. Accordingly, a specific moving pressing module at the outermost side in the forward movement direction (e.g., 300c in FIGS. 1 to 3) may not need the shock absorber 314. The position of the shock absorber 314 can be appropriately adjusted, thereby being able to support appropriate positions of other moving pressing modules. The shock absorber 314 does not need to support the outermost sides of other moving pressing modules and may support the inner frames of the moving pressing modules, etc. It is possible to variously adjust the gap between the moving pressing modules by selecting positions. A plurality of moving pressing modules are enabled to move forward while maintaining appropriate gaps by increasing or decreasing the length of the shock absorber 314 by a required amount.

The pressing unit 321 may be disposed at an appropriate position at the second elevator 320. For example, when the entire second elevator 320 is positioned over the supporting plate 100, the pressing unit 321 may be disposed at the lower end of the second elevator 320 in a flat structure. The pressing unit 321 comes in contact with the stacked film A2 earlier than the blade (see 221 in FIGS. 4 and 5) forward in the forward movement direction, thereby pressing and aligning the stacked film A2. As shown in FIG. 7, the pressing unit 321 may include a plurality of supporting rollers 321a spaced apart from each other in rolling contact with the outer surface of the stacked film A2. It is possible to press the stacked film A2 while moving using the supporting rollers 321a. However, the present disclosure is not necessarily limited to this configuration, and the pressing unit 321 may be modified in other types that can press and align the surface of the stacked film A2.

The moving pressing module 300a may include a heating unit 322 that induces thermal deformation of the stacked film A2 by heating the outer surface of the stacked film A2. That is, it is possible to induce the stacked film A2 to be at least partially deformed by applying heat while providing pressure through the pressing unit 321. Since pressure is applied by the pressing unit 321, the induced deformation may be enough to weaken the bonding between the stacked film A2 and a glass plate (see A1 in FIG. 1) even if thermal deformation is not excessively shown in the external appearance. That is, it is possible to make the stacked film A2 be easily separated by heating the stacked film A2 with the moving pressing module 300a before cutting it with the blade 221. Further, it is possible to remove any problems when the blade 221 enters the stacked film by pressing and aligning the stacked film with the pressing unit 321.

Referring to FIG. 7, the pressing unit 321 includes a plurality of supporting rollers 321a spaced apart from each other in rolling contact with the outer surface of the stacked film A2, and the heating unit 322 may be a heater that radiates heat to the space between the supporting rollers 321a in the pressing unit 321. That is, it is possible to simultaneously provide pressure and heat to substantially the same surface by disposing the heating unit 322 to overlap the pressing unit 321. The heater that is the heating unit 322, for example, may discharge at least any one of infrared beams or hot wind. For example, it is possible to provide heat in various ways such as a radiation heating type that discharges hot rays such as infrared beams to the space between the supporting rollers 321 or a convection heating type that heats the entire surrounding by feeding heated fluid. However, the manner of providing heat is not necessarily limited thereto, and other heating manners may also be freely used, if possible.

A gap control rod 313 may be disposed at the moving pressing module 300a. The gap control rod 313 is disposed between the moving scraper module (see 200 in FIGS. 1 to 3) and the moving pressing module 300a, thereby controls a gap such that the blade 221 and the pressing unit 321 are adjacent to but not in close contact with each other. Accordingly, a slit (see B in the enlarged view of FIG. 8) that passes the stacked film A2 may be formed particularly between the blade 221 and the pressing unit 321. As shown in FIGS. 6 and 7, the gap control rod 313 may protrude from a side of the second body 310 which faces the moving scraper module 200, and may have a shock-absorbing structure at the end thereof. It is also possible, if necessary, to change the length of the gap control rod 313 and the size of the slit B as well. The gap control rod 313 is not necessarily formed at the moving pressing module 300a, so it may be formed at the moving scraper module 200 in another embodiment.

A bending pressing plate 323 may be disposed at the moving pressing module 300a. As shown in FIGS. 6 and 7, the bending pressing plate 323 is disposed at the end of the pressing unit 321 which faces the blade 221, and deforms the stacked film A2, which has passed through the slit B, into a stacked film coil (see A2-1 in FIG. 9) by pressing the stacked film A2 with a curved surface. The bending pressing plate 323 may have at least two curved surfaces that are inversed with respect to each other. The curved surface that presses the stacked film A2 may be formed at the upper end portion of the bending pressing plate 323 and the shape thereof may be that shown in FIG. 7. The bending pressing plate 323 may have a breakpoint, and accordingly, another curved surface bending in the opposite direction to the upper end portion may be formed at the lower end portion. In particular, it is possible to freely change the diameter, density, etc. of the stacked film coil A2-1 by appropriately adjusting the curvature of the curved surface at the upper end portion.

Figure 8:
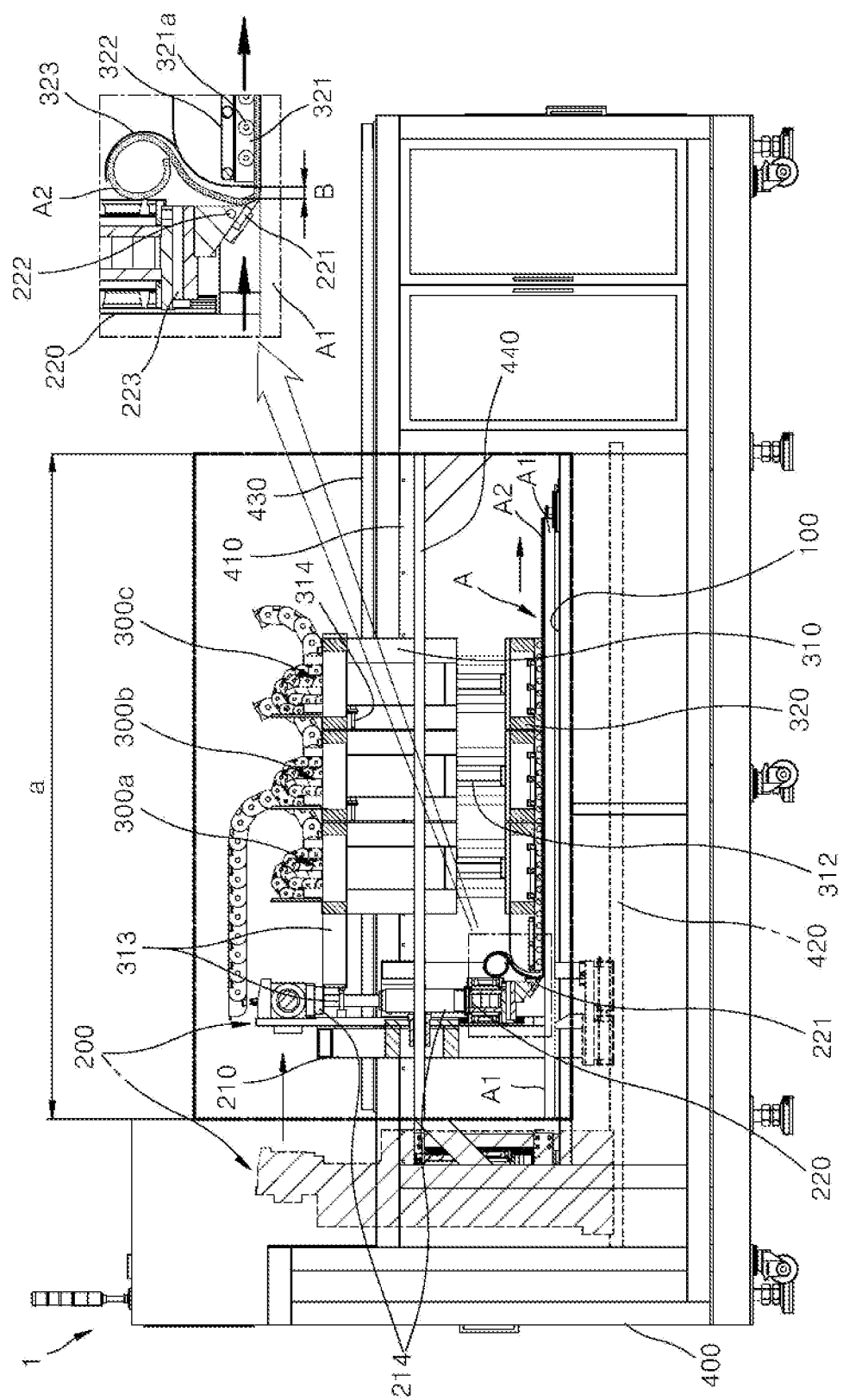
FIG. 8 is a view showing an operation of disassembling a solar panel by the solar panel disassembling apparatus of FIG. 1.
Figure 9:
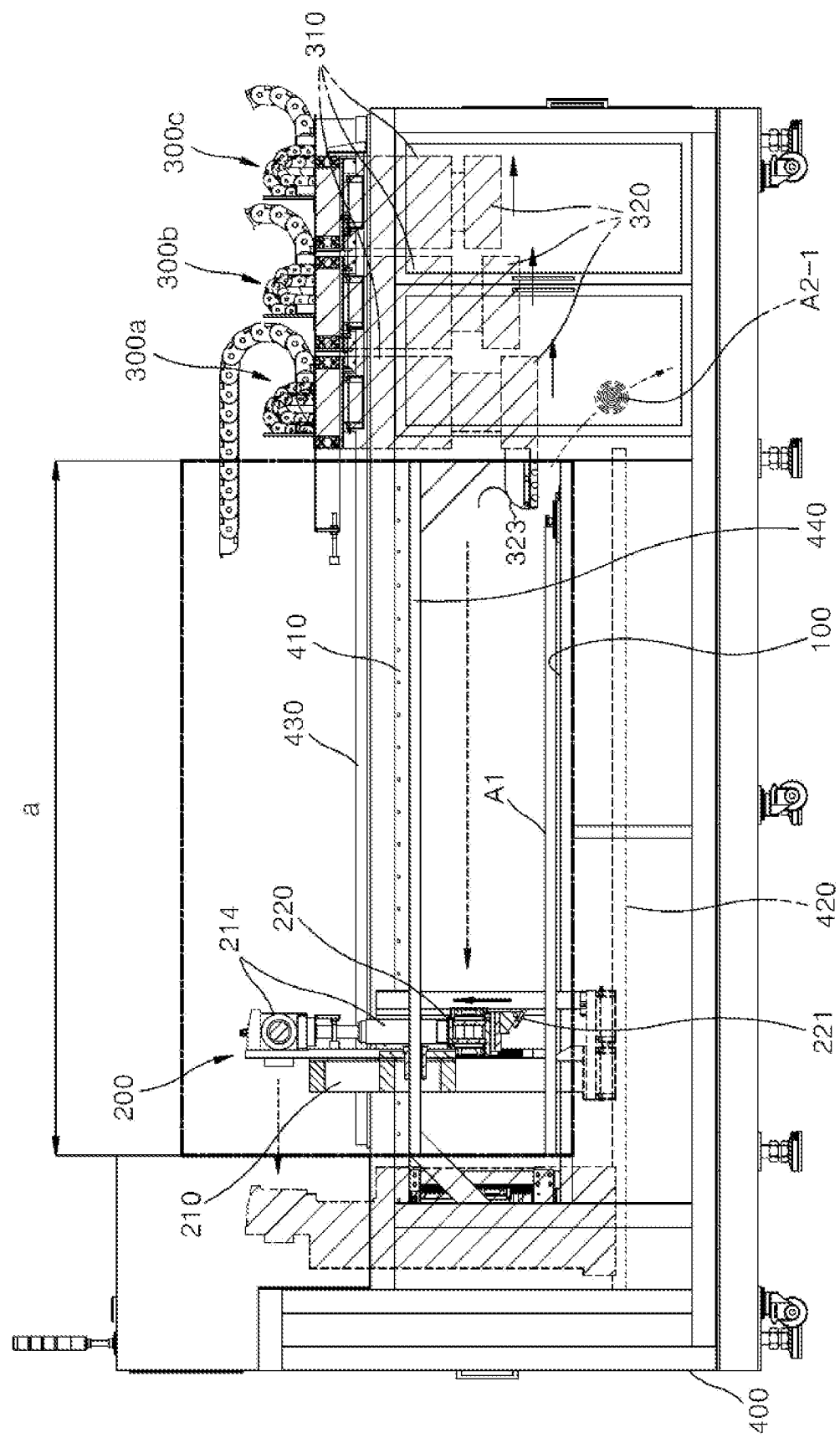
FIG. 9 is a view showing an operation after disassembling a solar panel by the solar panel disassembling apparatus of FIG. 1.

FIG. 8 is a view showing an operation of disassembling a solar panel by the solar panel disassembling apparatus of FIG. 1, and FIG. 9 is a view showing an operation after disassembling a solar panel by the solar panel disassembling apparatus of FIG. 1. Note that main components are all shown in cross-sectional views in the section a in which a solar panel is positioned in order to more clearly show the disassembling process.

According to the configuration described above, the solar panel disassembling apparatus 1 automatically disassembles a solar panel A while operating as follows. Disassembling is described hereafter with reference to FIG. 8. The moving scraper module 200 brings the blade 221 in contact with the solar panel A by moving down the blade 221 at the start position (which is the same as the above description, see FIG. 5) and then moves forward. As described above, the blade 221 can be controlled to be stopped with the end on the surface of the glass plate A1 at the start position by the load cell (see 110 in FIGS. 4 and 5) and the controller (see 500 in FIGS. 4 and 5). That is, the blade 221 can cut the stacked film A2 with the end accurately positioned at the bonding position of the glass plate A1 and the stacked film A2.

As described above, when the start position is the same as the retreat position of the moving scraper module 200, the moving scraper module 200 can move forward while immediately moving down the blade 221. However, since the retreat position and the start position may be different depending on situations, in this case, a prior operation of slightly moving the moving scraper module 200 from the retreat position to the start position may be performed, as described above. This may depend on situations. The moving pressing modules 300a, 300b, and 300c are prepared substantially in close contact with the moving scraper module 200 in which the moving scraper module 200 has been retreated before operating. In this state, the second elevator 320 may be in contact with the stacked film A2 by automatically moving down (e.g., the second elevator 320 may be enabled to automatically move down by installing a sensor, etc. at the lower portion). Thereafter, when the moving scraper module 200 moves, the moving pressing modules 300a, 300b, and 300c are pushed and moved together (when a driving force is not separately provided to the moving pressing modules, they can be manually prepared, but the same operation can be automatically performed without limit when an appropriate driving structure is applied to the moving pressing modules).

FIG. 8 shows a corresponding forward movement. The moving scraper module 200 and the moving pressing modules 300a, 300b, and 300c move together in close contact with each other while they move forward, as shown in FIG. 8. The shock absorber 314 can reduce the gap between the moving pressing modules by supporting the inner frames of the moving pressing modules. As described above, the moving pressing modules 300a, 300b, and 300c press and align the stacked film A2 with the pressing unit 321 ahead of the moving scraper module 200 and induce thermal deformation as well using the heating unit 322. Accordingly, the stacked film A2 is aligned flat in contact with the blade 221 with the bonding with the glass plate A1 weakened. The blade 221 can be heated and increased in temperature by the temperature adjuster 222 described above, thereby being able to more easily enter between the stacked film A2 and the glass plate A1. Accordingly, as shown in the enlarged view of FIG. 8, it is possible to cleanly separate the stacked film A2 from the glass plate A1 by cutting (or scraping out) the stacked film A2 from the glass plate A1.

In this process, the gap control rod 313 can form the slit B by adjusting the gap between the blade 221 and the pressing unit 321, and the cut stacked film A2 can be discharged through the slit B. The discharged stacked film A2 is pressed particularly by the curved surface of the bending pressing plate 323 and can be wound in a roll type as shown in the figures. Since the plasticity of the stacked film A2 is increased by heat even though it has elasticity, it can be very easily deformed by the bending pressing plate 323. Such a forward movement continues until the blade 221 reaches the second end of the solar panel A, and accordingly, the entire stacked film A2 can be cleanly separated and removed from the solar panel A. Since the stacked film A2 is cleanly removed from the solar panel A while the forward movement continues, only the glass plate A substantially remains behind the blade 221.

When the forward movement is finished and the stacked film A2 is completely separated, only the glass plate A1 remains on the supporting plate 100, as shown in FIG. 9. The moving scraper module 200 that finished moving forward retreats in the opposite direction. Further, the blade 221 also moves up with the first elevator 220. However, the moving pressing modules 300a, 300b, and 300c can keep being moved forward by inertia, and the second elevator 320 can move up when departing from the supporting plate 100. In particular, the moving pressing module 300a having the bending pressing plate 323 can discharge the stacked film coil A2-1 held by the bending pressing plate 323 into the housing while being separated from the retreated moving scraper module 200. The stacked film coil A2-1 can also fall down while constructing a parabola forward by inertia.

Accordingly, it is possible to very conveniently separate the solar panel (see A in FIG. 8) into the glass plate A1 and the stacked film coil A2-1. In particular, since the height of the blade 221 is automatically adjusted and the blade 221 is very accurately positioned at the bonding point between the stacked film and the glass plate, very clean disassembling is possible with little byproducts. As described above, it is possible to very conveniently and accurately disassemble a solar panel with the solar panel disassembling apparatus 1 of the present disclosure. The glass plate A1 and the stacked film coil A2-1 completely separated from each other can be disposed to different sides in the housing 400.

According to the present disclosure, it is possible to precisely disassemble a solar panel remaining after the exterior such as a frame is removed from a common solar module into a glass plate and a film-type stack. In particular, it is possible to accurately find out the bonding point between the glass plate and the stack and disassemble the solar panel, so disassembling is possible without substantial damage to the glass plate. Further, it is possible to cleanly separate the glass plate and the stack by inducing thermal deformation of the stack, and the separated parts can be very conveniently recycled. Further, since the disassembling process is very conveniently and quickly performed, it is possible to improve the efficiency of the entire process of disposing of a waste solar module.

Although exemplary embodiments of the present disclosure were described above with reference to the accompanying drawings, those skilled in the art would understand that the present disclosure may be implemented in various ways without changing the necessary features or the spirit of the prevent disclosure. Therefore, the embodiments described above are only examples and should not be construed as being limitative in all respects.

What is claimed is:

1. A solar panel disassembling apparatus that is configured to separate a glass plate by removing a stacked film from a solar panel comprised of the glass plate and the stacked film including solar cells stacked on the glass plate, the solar panel disassembling apparatus comprising:
   a supporting plate that supports the bottom of a solar panel so that a top surface thereof is in contact with a glass plate;
   a moving scraper module that includes a first body connected to a first guide and moving in parallel with the supporting plate, a first elevator coupled to the first body to be movable up and down and moving up and down perpendicular to a movement direction of the first body, and a blade disposed over the supporting plate, connected to the first elevator, and changing in height with respect to the supporting plate when the first elevator is operated, and that scrapes the stacked film using the blade while moving forward in parallel with the supporting plate; and
   a moving pressing module that includes a second body connected to a second guide and moving in parallel with the supporting plate, a second elevator coupled to the second body to be movable up and down and moving up and down perpendicular to a movement direction of the second body, and a pressing unit disposed over the supporting plate, connected to the second elevator, and changing in height with respect to the supporting plate when the second elevator is operated, that is disposed forward in a forward movement direction of the moving scraper module, and that presses and aligns the stacked film using the pressing unit ahead of the moving scraper module when the moving scraper module is moved forward,
   wherein the moving pressing module further includes a heating unit that induces thermal deformation of the stacked film by heating the outer surface of the stacked film.

2. The solar panel disassembling apparatus of claim 1, wherein the pressing unit includes a plurality of supporting rollers spaced apart from each other in rolling contact with the outer surface of the stacked film, and the heating unit is a heater that radiates heat to a space between the supporting rollers in the pressing unit.

3. The solar panel disassembling apparatus of claim 2, wherein the heater discharges at least any one of infrared beams or hot wind.

4. The solar panel disassembling apparatus of claim 1, wherein the moving scraper module further includes a temperature adjuster that increases the temperature of the blade by heating the blade.

5. The solar panel disassembling apparatus of claim 1, wherein the first body is connected to at least two pairs of guide bars that are in parallel with the supporting plate and spaced apart from each other, and
the at least two pairs of guide bars comprises a first pair of guide bars which are disposed higher than the blade, and a second pair of guide bars which are disposed lower than the blade.

6. The solar panel disassembling apparatus of claim 1, wherein a plurality of moving pressing modules that can be separably coupled to each other is continuously disposed forward in a forward movement direction of the moving scraper module.

7. A solar panel disassembling apparatus that is configured to separate a glass plate by removing a stacked film from a solar panel comprised of the glass plate and the stacked film including solar cells stacked on the glass plate, the solar panel disassembling apparatus comprising:
a supporting plate that supports the bottom of a solar panel so that a top surface thereof is in contact with a glass plate;
a moving scraper module that includes a first body connected to a first guide and moving in parallel with the supporting plate, a first elevator coupled to the first body to be movable up and down and moving up and down perpendicular to a movement direction of the first body, and a blade disposed over the supporting plate, connected to the first elevator, and changing in height with respect to the supporting plate when the first elevator is operated, and that scrapes the stacked film using the blade while moving forward in parallel with the supporting plate;
a moving pressing module that includes a second body connected to a second guide and moving in parallel with the supporting plate, a second elevator coupled to the second body to be movable up and down and moving up and down perpendicular to a movement direction of the second body, and a pressing unit disposed over the supporting plate, connected to the second elevator, and changing in height with respect to the supporting plate when the second elevator is operated, that is disposed forward in a forward movement direction of the moving scraper module, and that presses and aligns the stacked film using the pressing unit ahead of the moving scraper module when the moving scraper module is moved forward; and
a load cell that is disposed under the solar panel at a start position where the blade starts to come in contact with the solar panel; and a controller that brings the blade in contact with the solar panel by moving down the first elevator at the start position and that adjusts a position of the blade by controlling the operation of the first elevator in accordance with at least any one of magnitude and a variation of load sensed by the load cell,
wherein the moving pressing module further includes a heating unit that induces thermal deformation of the stacked film by heating the outer surface of the stacked film.

8. A solar panel disassembling apparatus that is configured to separate a glass plate by removing a stacked film from a solar panel comprised of the glass plate and the stacked film including solar cells stacked on the glass plate, the solar panel disassembling apparatus comprising:
a supporting plate that supports the bottom of a solar panel so that a top surface thereof is in contact with a glass plate;
a moving scraper module that includes a first body connected to a first guide and moving in parallel with the supporting plate, a first elevator coupled to the first body to be movable up and down and moving up and down perpendicular to a movement direction of the first body, and a blade disposed over the supporting plate, connected to the first elevator, and changing in height with respect to the supporting plate when the first elevator is operated, and that scrapes the stacked film using the blade while moving forward in parallel with the supporting plate;
a moving pressing module that includes a second body connected to a second guide and moving in parallel with the supporting plate, a second elevator coupled to the second body to be movable up and down and moving up and down perpendicular to a movement direction of the second body, and a pressing unit disposed over the supporting plate, connected to the second elevator, and changing in height with respect to the supporting plate when the second elevator is operated, that is disposed forward in a forward movement direction of the moving scraper module, and that presses and aligns the stacked film using the pressing unit ahead of the moving scraper module when the moving scraper module is moved forward; and
a gap control rod that is disposed between the moving scraper module and the moving pressing module and forms a slit for passing the stacked film between the blade and the pressing unit by adjusting a gap,
wherein the moving pressing module further includes a heating unit that induces thermal deformation of the stacked film by heating the outer surface of the stacked film.

9. The solar panel disassembling apparatus of claim 8, further comprising a bending pressing plate that is disposed at an end of the pressing unit which faces the blade, and deforms the stacked film, which has passed through the slit, into a stacked film coil by pressing the stacked film with a curved surface.

* * * * *